United States Patent
Davis et al.

(10) Patent No.: US 10,912,225 B2
(45) Date of Patent: Feb. 2, 2021

(54) SYSTEMS HAVING FLUID CONDUIT CARRIERS FOR HOLDING DIFFERENT PORTIONS OF A FLUID CONDUIT AND METHODS OF USING THE SAME

(71) Applicant: Lenovo Enterprise Solutions (Singapore) Pte. Ltd., New Tech Park (SG)

(72) Inventors: Alvin Gregory Davis, Research Triangle Park, NC (US); Jim Drake, Research Triangle Park, NC (US); Jeffrey Scott Holland, Newton, NC (US); Vinod Kamath, Raleigh, NC (US); Timothy Andreas Meserth, Durham, NC (US); Glenn Myrto, Research Triangle Park, NC (US); Leo H. Webster, Research Triangle Park, NC (US); James Scott Womble, Research Triangle Park, NC (US); Jean J. Xu, Research Triangle Park, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 0 days.

(21) Appl. No.: 16/665,440

(22) Filed: Oct. 28, 2019

(65) Prior Publication Data
US 2020/0281094 A1    Sep. 3, 2020

Related U.S. Application Data

(60) Provisional application No. 62/812,209, filed on Feb. 28, 2019.

(51) Int. Cl.
  H05K 7/20 (2006.01)
  G06F 1/20 (2006.01)

(52) U.S. Cl.
  CPC ........... *H05K 7/20272* (2013.01); *G06F 1/20* (2013.01)

(58) Field of Classification Search
  CPC .................................................... G06F 1/20
  See application file for complete search history.

(56) References Cited

U.S. PATENT DOCUMENTS

2014/0126142 A1*  5/2014  Dean .................. G06F 1/20
                                                361/679.47

* cited by examiner

*Primary Examiner* — Jerry Wu
(74) *Attorney, Agent, or Firm* — Olive Law Group, PLLC

(57) ABSTRACT

Systems having fluid conduit carriers for holding different portions of a fluid conduit and methods of using the same are disclosed herein. According to an aspect, a system includes a fluid conduit comprising a first portion and a second portion that are fluidly connected to each other for carrying cooling fluid proximate to a first electronic component and a second electronic component of a computing device. The system also includes a first fluid conduit carrier configured to hold the first portion of the conduit. Further, the system includes a second fluid conduit carrier configured to hold the second portion of the conduit. The first fluid conduit carrier and the second fluid conduit carrier are configured to connect to one another.

20 Claims, 9 Drawing Sheets

SYSTEMS HAVING FLUID CONDUIT CARRIERS FOR HOLDING DIFFERENT PORTIONS OF A FLUID CONDUIT AND METHODS OF USING THE SAME

CROSS REFERENCE TO RELATED APPLICATION

This application claims priority to U.S. Provisional Patent Application No. 62/812,209, filed Feb. 28, 2019, and titled SELECTIVELY SERVICEABLE MULTIPLE NODE COOLING SYSTEMS, SERVERS, SERVER TRAYS, AND RELATED METHODS, the content of which is incorporated herein by reference in its entirety.

TECHNICAL FIELD

The presently disclosed subject matter relates generally to computing devices. Particularly, the presently disclosed subject matter relates to systems having fluid conduit carriers for holding different portions of a fluid conduit and methods of using the same.

BACKGROUND

Fluid cooling systems and devices for computing equipment and devices are typically structural, stiff, complicated, heavy parts that require many mounting points with an underside topography to provide direct conduction of fluid (e.g., water) to a variety of electronic components and system board components of different heights and positions. For example, fluid may be moved near processors, memory components, and the like to maintain or reduce temperature of these components to a suitable operational temperature. Such systems and devices are often used to cool the components of servers residing within data centers.

In a data center, servers may require installation and servicing of their internal components. Due to the large size and weight of some carriers for fluid conduits and other internal components of servers, installation and service personnel may have difficulty placing or managing these fluid cooling systems in servers without inadvertently contacting and potentially damaging internal server components. In view of these difficulties, there is a need for improved systems and techniques for installing fluid cooling components within computing devices.

SUMMARY

The presently disclosed subject matter provides systems having fluid conduit carriers for holding different portions of a fluid conduit and methods of using the same. According to an aspect, a system includes a fluid conduit comprising a first portion and a second portion that are fluidly connected to each other for carrying cooling fluid proximate to a first electronic component and a second electronic component of a computing device. The system also includes a first fluid conduit carrier configured to hold the first portion of the conduit. Further, the system includes a second fluid conduit carrier configured to hold the second portion of the conduit. The first fluid conduit carrier and the second fluid conduit carrier are configured to connect to one another.

According to another aspect, a method includes providing a system including a fluid conduit comprising a first portion and a second portion that are fluidly connected to each other. The system also includes a first fluid conduit carrier holding the first portion of the conduit. Further, the system includes a second fluid conduit carrier holding the second portion of the conduit. The method also includes aligning the first fluid conduit carrier with a first electronic component of a computing device for positioning the first portion of the fluid conduit to carry cooling fluid proximate to the first electronic component. Further, the method includes aligning the second fluid conduit carrier with a second electronic component of the computing device for positioning the second portion of the fluid conduit to carry cooling fluid proximate to the second electronic component. The method also includes releasing the second fluid conduit carrier from the second portion of the conduit.

According to another aspect, a method includes providing a system including a fluid conduit comprising a first portion and a second portion that are fluidly connected to each other, the first portion and the second portion configured to carry cooling fluid proximate to a first electronic component and a second electronic component, respectively, of a computing device, the first and second portions each comprising a first side facing away from the computing device and a second side facing the computing device. The system also includes a fluid conduit carrier configured to hold the first portion of the conduit. The method also includes aligning the fluid conduit carrier with the first portion of the fluid conduit. Further, the method includes articulating the fluid conduit carrier such that the first side of the first portion of the fluid conduit faces the first side of the second portion of the fluid conduit. The method also includes releasing the fluid conduit carrier from the first portion of the conduit.

BRIEF DESCRIPTION OF THE DRAWINGS

Figure 1A:
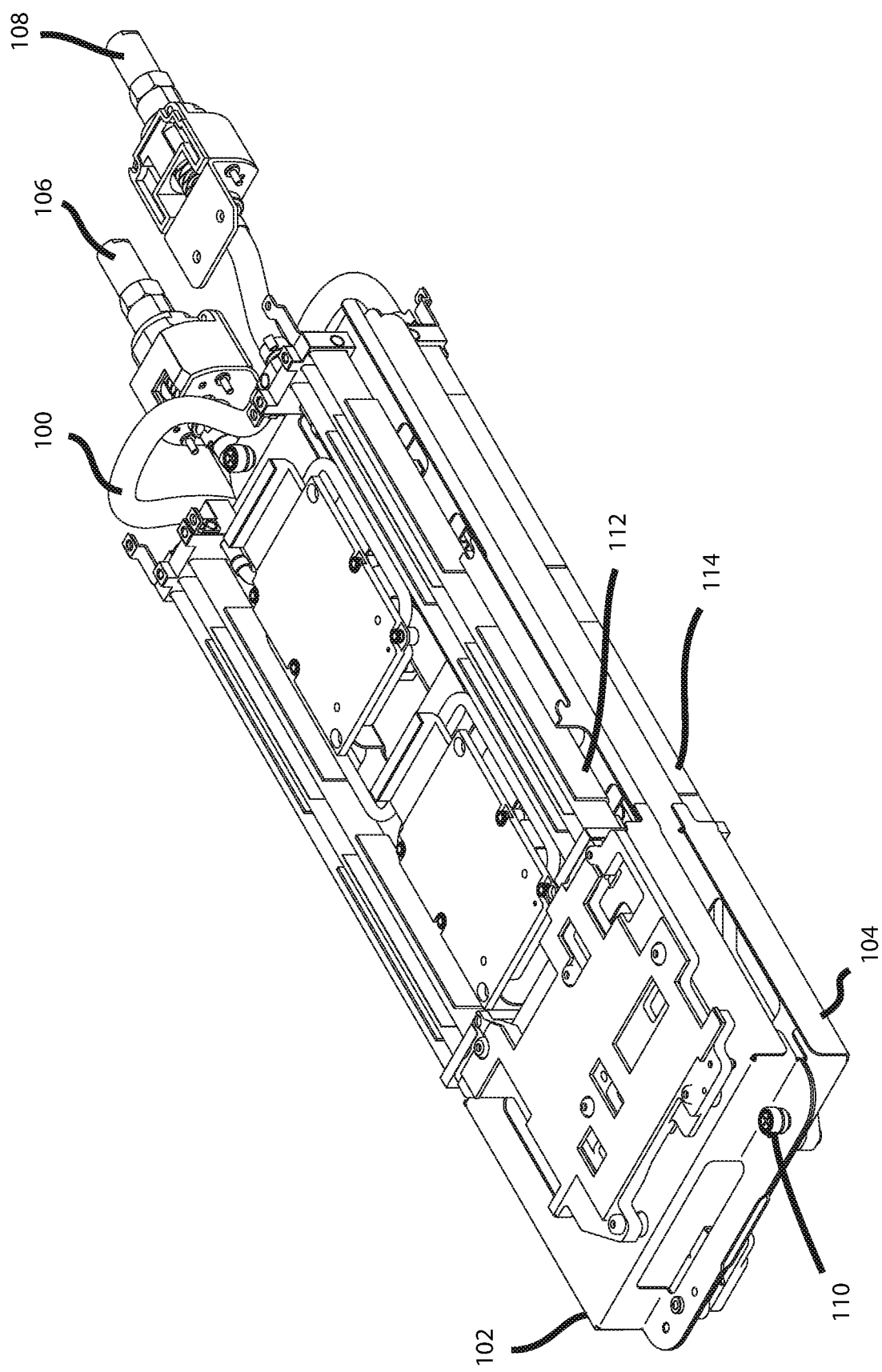
Figure 1B:
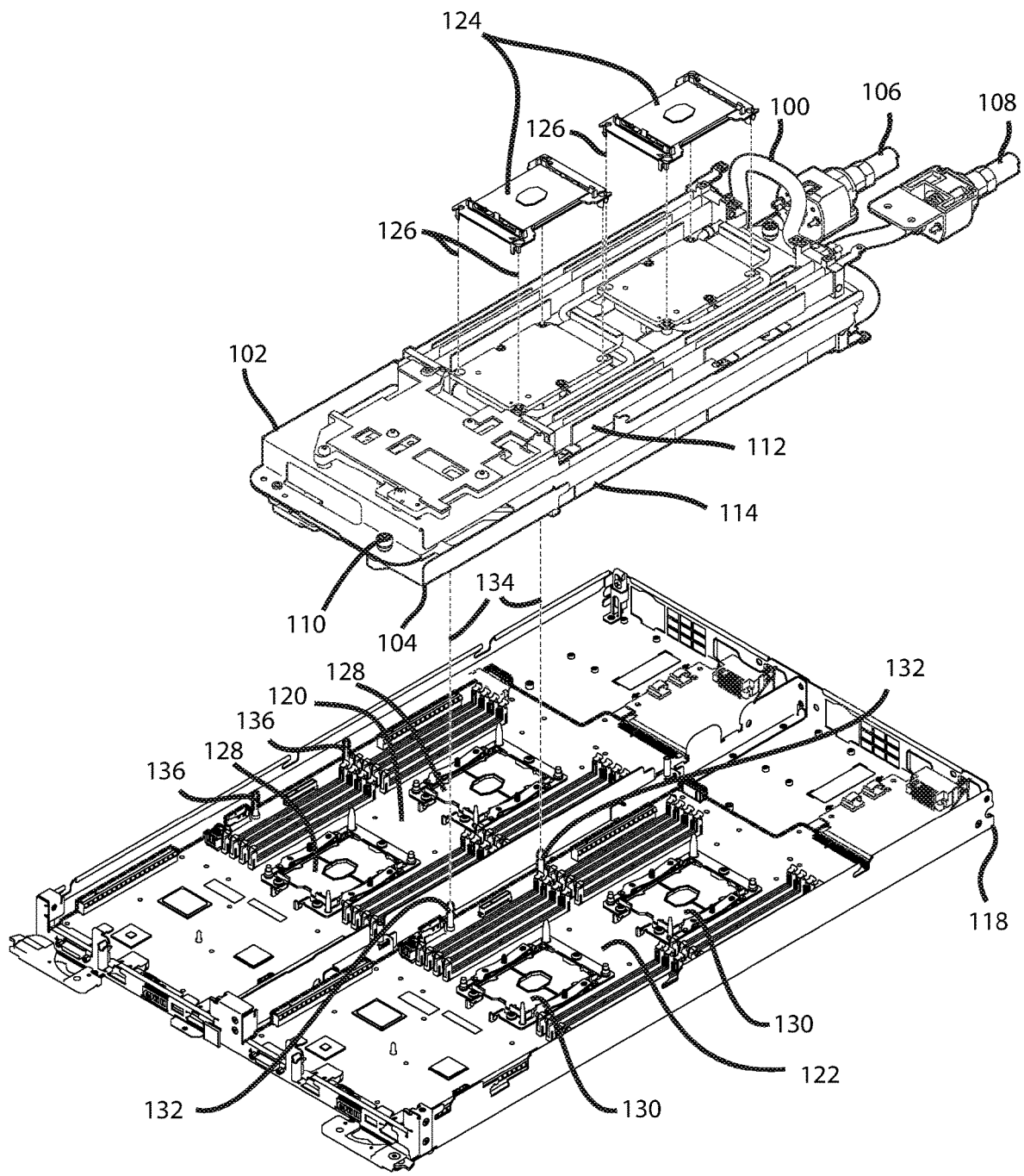
Figure 2A:
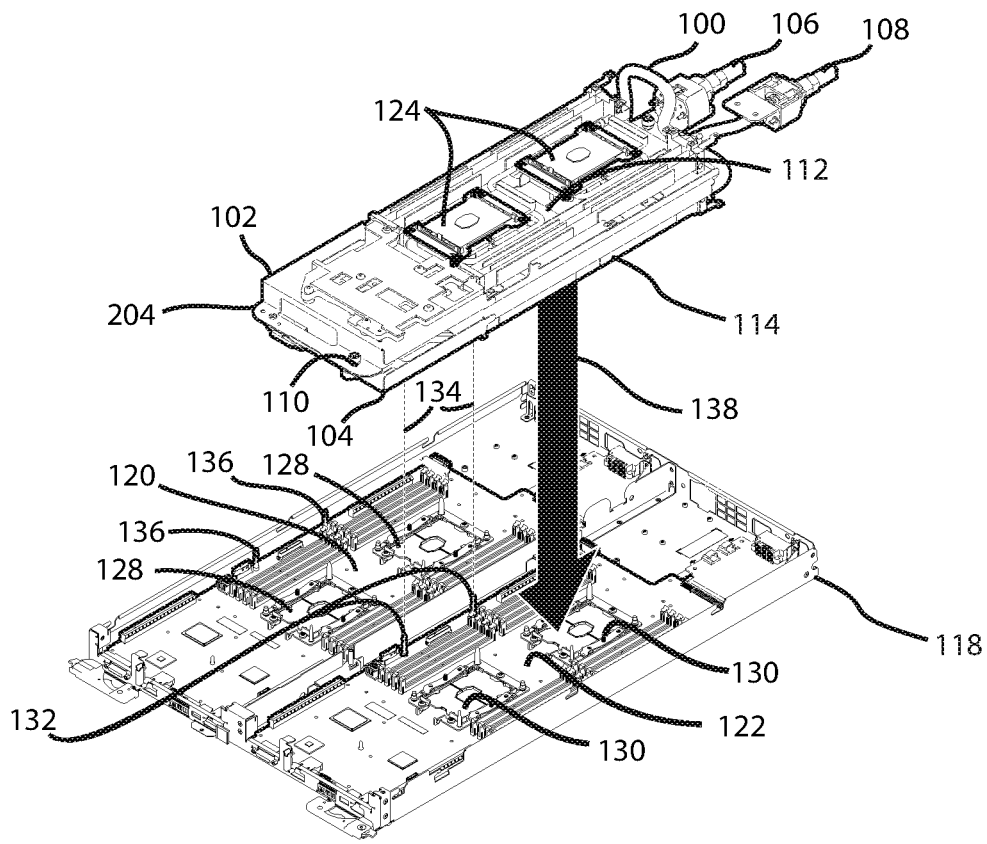
Figure 2B:
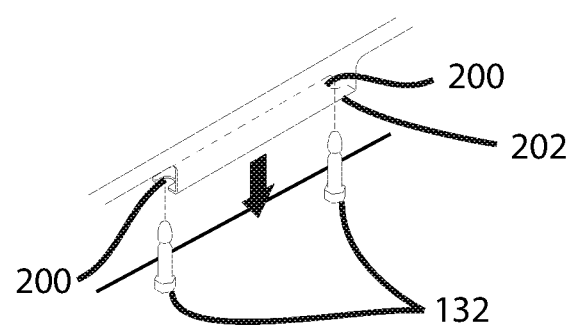
Figure 2C:
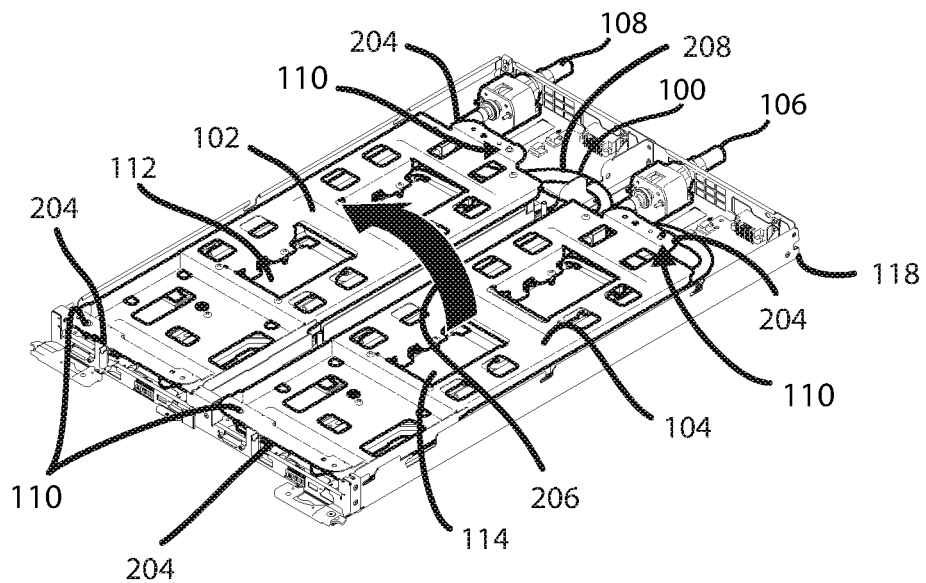
Figure 2D:
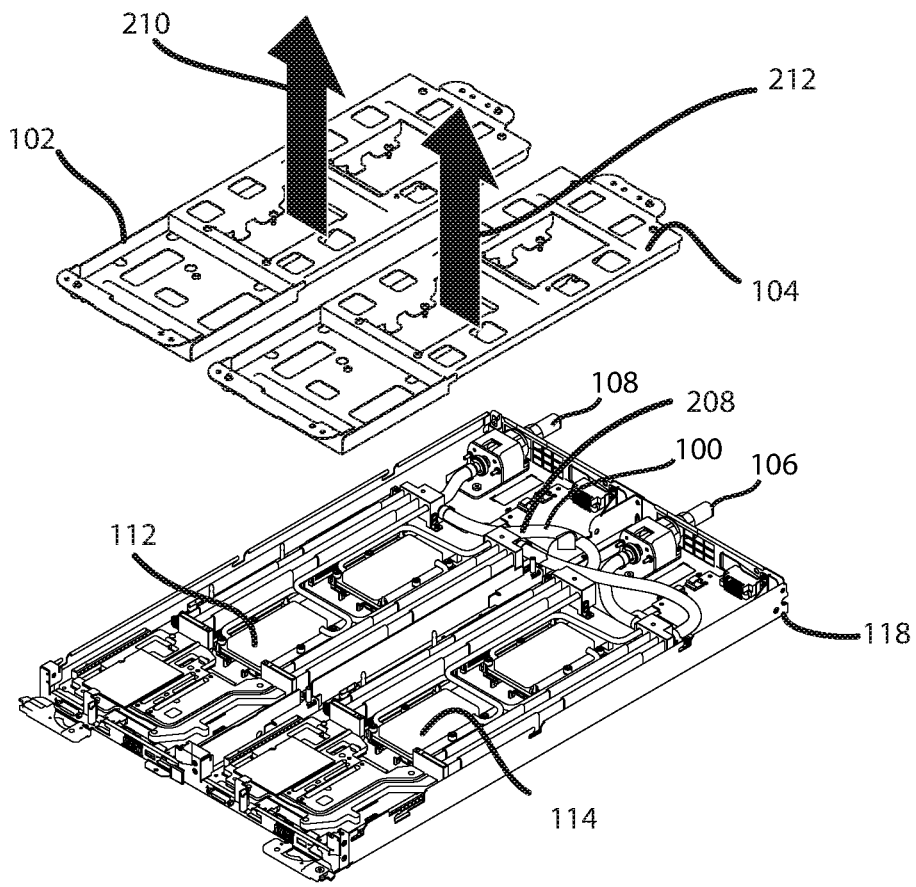
Figure 3A:
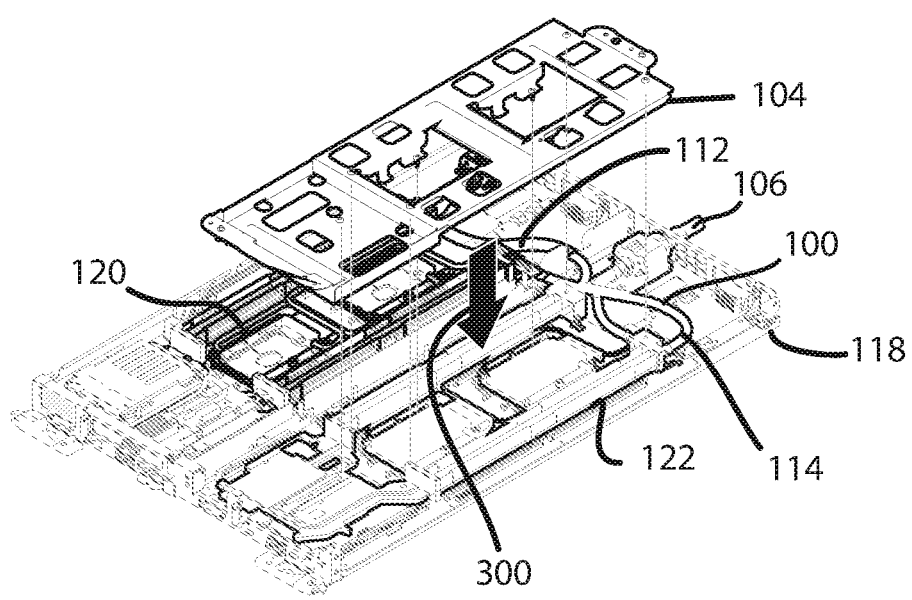
Figure 3B:
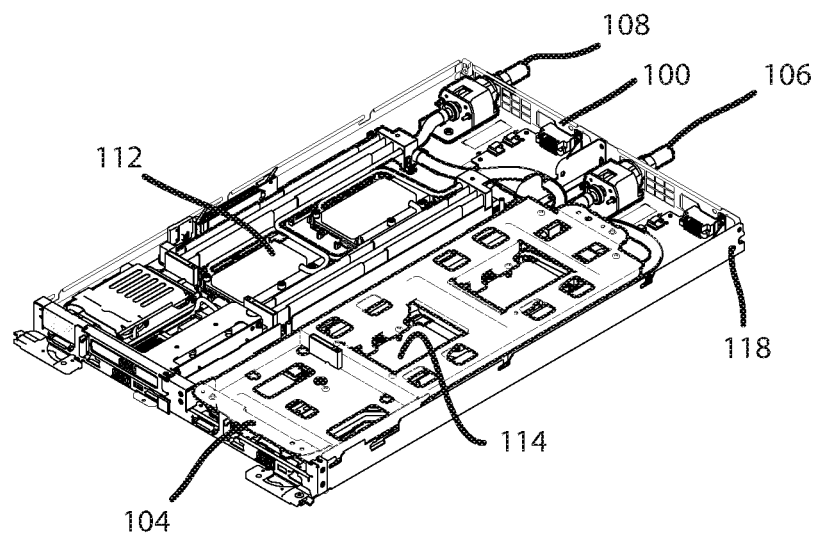
Figure 3C:
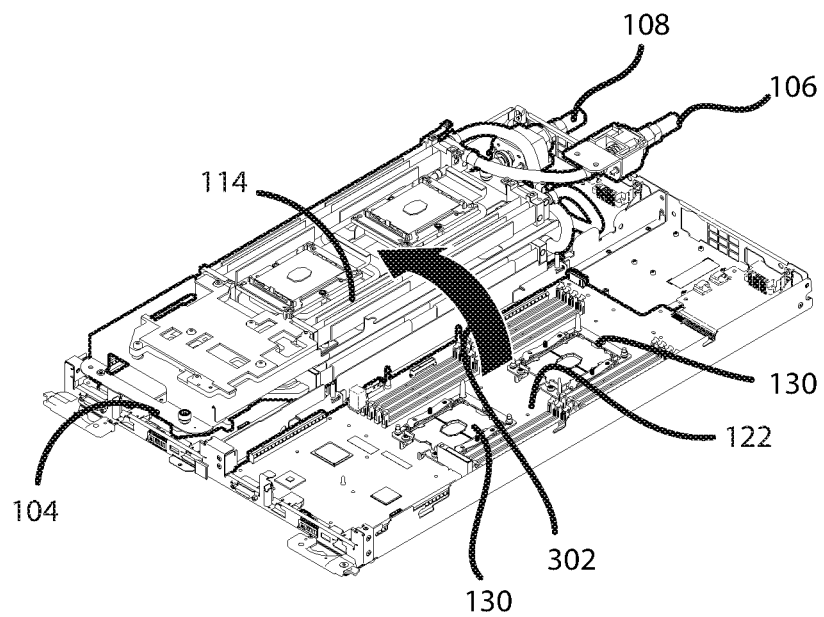
Figure 3D:
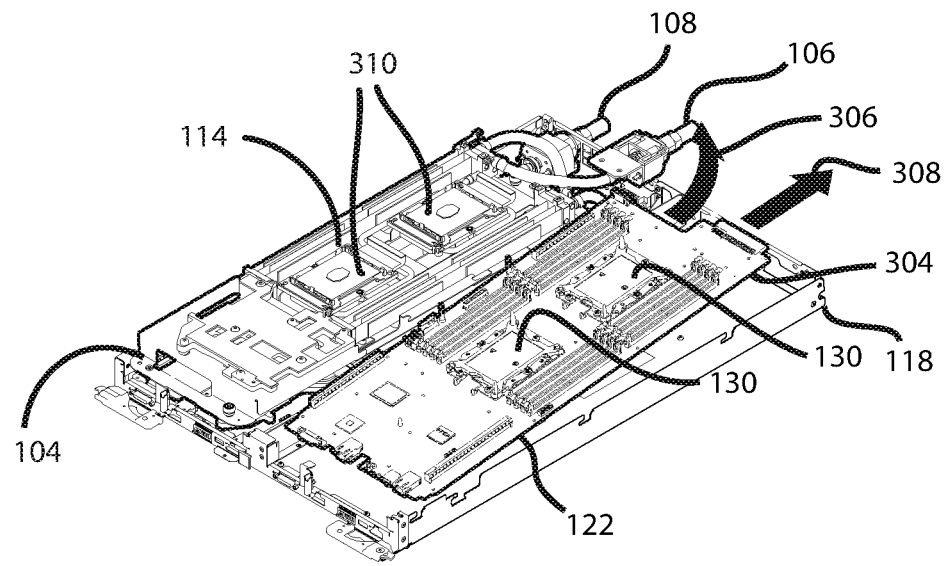
Figure 3E:
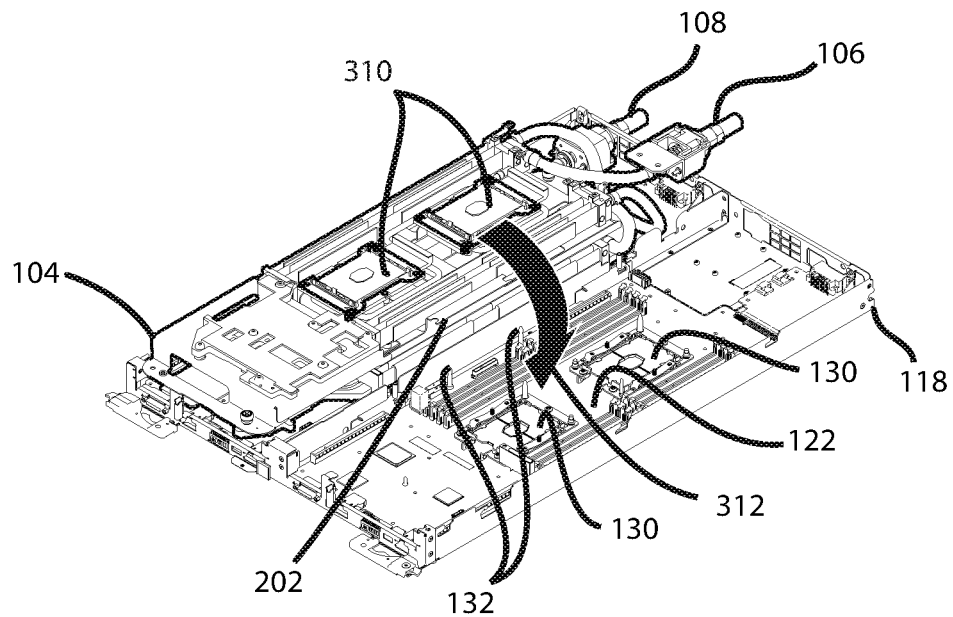
Figure 4A:
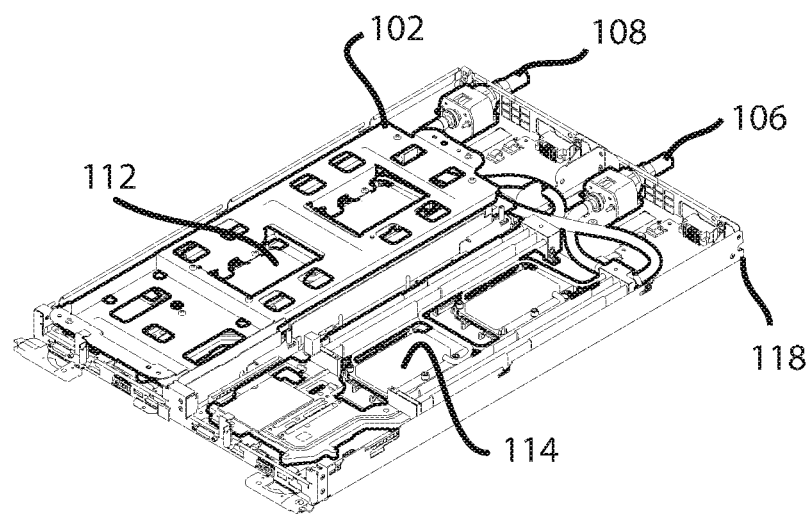
Figure 4B:
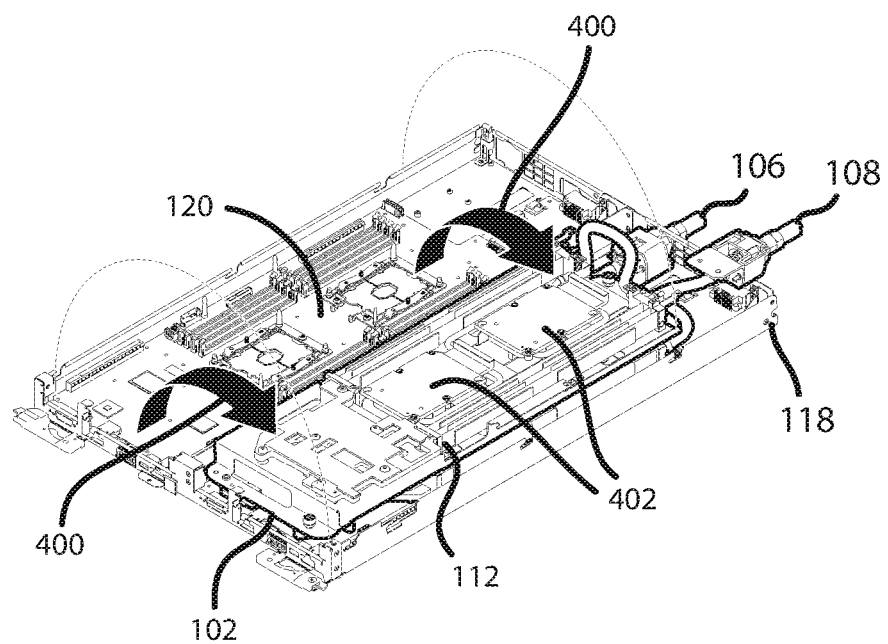
Figure 4C:
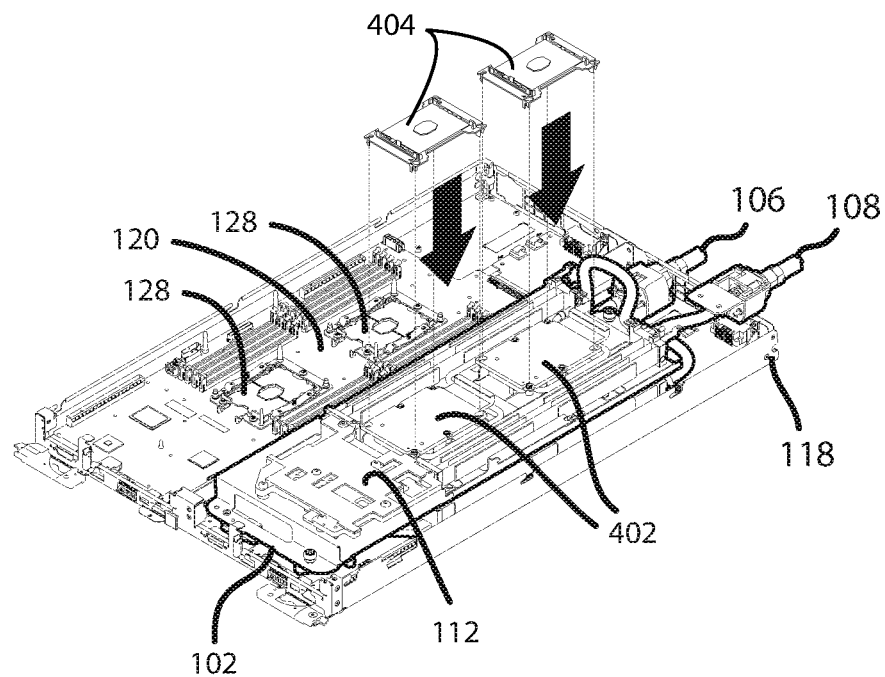
Figure 4D:
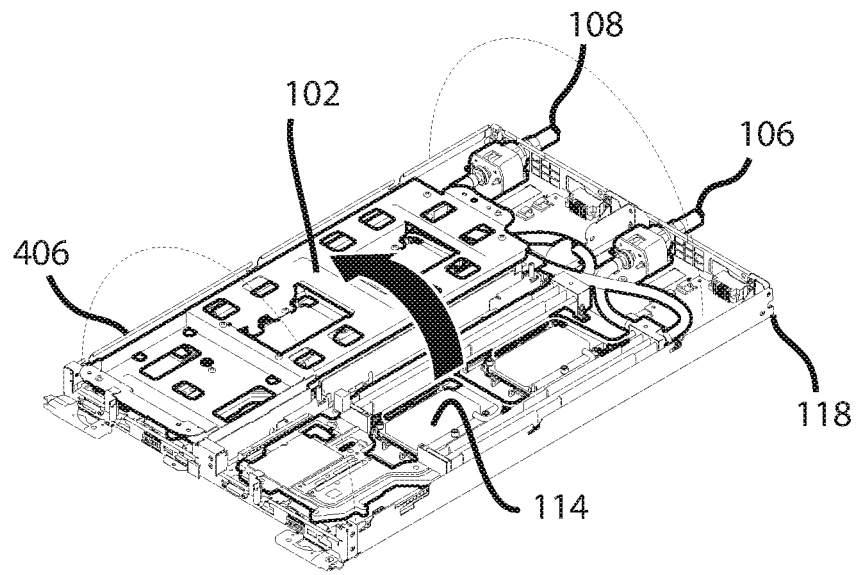

Having thus described the presently disclosed subject matter in general terms, reference will now be made to the accompanying drawings, which are not necessarily drawn to scale, and wherein:

FIG. 1A is a top perspective view of a fluid conduit being held by two fluid conduit carriers and that are attached together in accordance with embodiments of the present disclosure;

FIG. 1B is a top perspective view showing the fluid conduit and fluid conduit carriers in position for installation in a computing device in accordance with embodiments of the present disclosure;

FIG. 2A is a top perspective view of an example installation step for the carrier shown in FIG. 1B in accordance with embodiments of the present disclosure;

FIG. 2B is a detailed perspective view of pins in alignment with corresponding alignment features of a fluid conduit carrier in accordance with embodiments of the present disclosure;

FIG. 2C is a top perspective view of example installation steps for detaching a first fluid conduit carrier from a second fluid conduit carrier, rotating the first fluid conduit carrier with respect to the second fluid conduit carrier, and aligning the first fluid conduit carrier with an electronic component of a computing device and for positioning a portion of the fluid conduit to carry cooling fluid proximate to the electronic component in accordance with embodiments of the present disclosure;

FIG. 2D is a top perspective view of example steps of releasing a fluid conduit carrier from a portion of the fluid conduit and releasing a carrier from a portion of the fluid conduit in accordance with embodiments of the present disclosure;

FIG. 3A is a top perspective view of an example step of aligning a fluid conduit carrier of FIGS. 1A, 1B, and 2A-2D with an electronic component of the computing device for positioning a portion of the fluid conduit to carry cooling fluid proximate to the electronic component in accordance with embodiments of the present disclosure;

FIG. 3C is a top perspective view of an example step following the example step of FIG. 3B of articulating and rotating the fluid conduit carrier in accordance with embodiments of the present disclosure;

FIG. 3D is a top perspective view of an example step following the step of FIG. 3C of removing a system board from the computing device in accordance with embodiments of the present disclosure;

FIG. 3E is a top perspective view of an example step of articulating and rotating the fluid conduit carrier to place the processors and a portion of the conduit back in operable position in accordance with embodiments of the present disclosure;

FIG. 4A is a top perspective view of an example step of positioning a portion of the fluid conduit to carry cooling fluid proximate to its respective system board in accordance with embodiments of the present disclosure;

FIG. 4B is a top perspective view of an example step of articulating the carrier of FIG. 4A in accordance with embodiments of the present disclosure;

FIG. 4C is a top perspective view of an example step of installing example processors to the portion of the fluid conduit in accordance with embodiments of the present disclosure; and FIG. 4D is a top perspective view of example steps of installing processors to the system board in accordance with embodiments of the present disclosure.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

As used herein, the term "fluid conduit" is any system that provides passage of fluid near or proximate to one or more electronic components of a computing device for maintaining or reducing the temperature of these electronic component(s). In an example, a fluid conduit may reside within a server and include an inlet connector for receiving fluid (e.g., cooled water) and an outlet connector for exit of the fluid. The received fluid may be circulated in proximity to the electronic components (e.g., processors, memory components, and the like) such that heat is transferred to the fluid in order for the electronic components to maintain or reduce their respective temperatures. A fluid conduit may include a tubular shaped component that is shaped and sized for moving the fluid near electronic components of the computing device. Further, the fluid conduit may be entirely or partially made of flexible material. A fluid conduit may also include supportive components for suitably holding the fluid conduit in place within the computing device. In an example, one or more carriers (or fluid conduit carriers) may hold the fluid conduit such that the fluid conduit may be installed into a computing device, moved within the computing device during servicing, or otherwise used for movement of all or a portion of the fluid conduit.

As referred to herein, the terms "fluid conduit carrier" or "carrier" may be any suitable structure that can support or hold a fluid conduit. In accordance with embodiments of the present disclosure, multiple fluid conduit carriers may be used for holding a single fluid conduit. For example, in one arrangement the fluid conduit carriers may be positioned such that the fluid conduit is folded over itself or in another compacted configuration for ease of movement and positioned by servicing or installation personnel. Once suitably positioned, at least a portion of the fluid conduit may be installed into the computing device, serviced, or in a position such that other components of the computing device may be serviced. Subsequently, one of the carriers may be moved and positioned such that the other portion of the fluid conduit may be installed or serviced. A carrier may be made of one or more rigid, structural components. For example, components of the carrier may be made of metal. Further, a carrier may include one or more alignment features that can be used to align the carrier with, for example, an electronic component of the computing device or another carrier of the computing device for the purpose of installing the fluid conduit or an electronic component.

Unless otherwise defined, all technical terms used herein have the same meaning as commonly understood by one of ordinary skill in the art to which this disclosure belongs.

In accordance with embodiments of the present disclosure, systems having fluid conduit carriers for holding different portions of a fluid conduit and methods of using the same are disclosed herein. These systems may be used for assisting operators to install fluid conduits into computing devices, such as servers. Further, these systems may be used for assisting operators to access internal components of computing devices, such as servers, when servicing the computing devices.

As referred to herein, the term "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. A computing device may be a server or any other type of computing device. For example, a computing device can be any type of conventional computer such as a laptop computer or a tablet computer.

As used herein, the term "electronic component" refers to any component that operates as part of a computing device. Example electronic components include, but are not limited to, a system board, a processor, a memory device, a dual in-line memory module (DIMM), or the like.

As used herein, the term "memory" or "memory device" is generally a storage device of a computing device. Examples include, but are not limited to, read-only memory (ROM), a dual in-line memory module (DIMM), and random access memory (RAM).

FIG. 1A illustrates a top perspective view of a fluid conduit 100 being held by two fluid conduit carriers 102 and 104 that are attached together in accordance with embodiments of the present disclosure. In this attached configuration of the fluid conduit carriers 102 and 104, the fluid conduit carriers 102 and 104 are fastened together in a stacked arrangement such that installation and service personnel may more easily manage the placement, installation, and servicing of the fluid conduit 100, its components, and/or the internal components of a server (not shown) in which the fluid conduit is installed. As will be described in more detail herein, the fluid conduit carriers 102 and 104 may initially be stacked and the fluid conduit 100 folded upon itself as shown in FIG. 1A for facilitating handling and positioning by personnel. For example, during fluid conduit installation personnel may place the fluid conduit carriers 102 and 104 while in the stacked configuration such that a portion of the fluid conduit 100 is positioned and aligned for installation. After this portion of the fluid conduit is installed, the carriers 102 and 104 may be detached from each other and subsequently the carrier holding the other portion of the fluid conduit may be moved such that the other portion of the fluid conduit 100 is positioned and aligned for installation.

With continuing reference to FIG. 1A, this top perspective view shows an inlet connector 106 and an outlet connector 108 of the fluid conduit 100. Cooled fluid (e.g., water) may be passed into the inlet connector 106 for conveyance through the fluid conduit. Heat generated by electronic components or other components may be received by the fluid. The heated fluid may subsequently exit through the outlet connector 108. In this example, the fluid conduit 100 includes a flexible tube having multiple turns, such that portions of the tube are in proximity to heat-generating electronic components. The tube may be made of any suitable pliable material, such as rubber. It is noted that not all of the fluid conduit 100 can be seen in FIG. 1A, since portions of it are hidden from view by portions of the carriers 102 and 104. During operation, the inlet connector 106 and the outlet connector 108 may be suitably connected to a fluid cooling system within a data center for receipt of cooled fluid and for exit of heated fluid as will be understood by those of skill in the art.

Carriers 102 and 104 are shown as being fastened to each other in FIG. 1A such that a major side of carrier 102 faces a major side of carrier 104. The other major sides of carriers 102 and 104 face in opposing directions. In this example, a screw 110 may fasten carrier 102 to carrier 104. In addition, one or more other screws or mechanisms may be used to attach the carrier 102 and 104 to each other such that they form a unitary structure. The carriers 102 and 104 may include threaded portions that align such that the screw 110 may be inserted and turned to attach the carrier 102 and 104 together. The screw 110 and/or other screws or mechanisms attaching the carriers 102 and 104 together may be removed for releasing the carriers 102 and 104 from each other such that one or both of the carriers 102 and 104 may be positioned as desired with respect to each other for installation and servicing as described in more detail herein.

In general, the fluid conduit 100 includes two portions—portion 112 and portion 114—that are fluidly connected to each other for carrying cooling fluid between inlet connector 106 and outlet connector 108 and proximate to electronic components. Fluid conduit carrier 102 can hold the portion 112, and fluid conduit carrier 104 can hold the other portion 114. When the carrier 102 and 104 are released from their attachment to each other, the portions 112 and 114 may be suitably moved to position for installation and/or servicing with respect to a computing device.

FIG. 1B illustrates a top perspective view showing the fluid conduit 100 and fluid conduit carriers 102 and 104 in position for installation in a computing device 118 in accordance with embodiments of the present disclosure. Although not shown in FIG. 1B, it should be understood that the computing device 118 may also include a housing and other components. In general, the unitary structure configuration of the carriers 102 and 104 may be properly placed and the portion 114 of the fluid conduit 100 installed. Subsequently, the carriers 102 and 104 may be released from their attachment such that the carrier 102 may be moved to a position such that the portion 112 of the fluid conduit 100 may be properly placed and the portion 112 of the fluid conduit 100 installed. It is noted that the order of installation of the portions 112 and 114 may be switched. After portions 112 and 114 are positioned, they may be suitably attached to the computing device 118. It is noted that these steps (described in further detail herein) may be suitably reversed entirely or in part for facilitating access to components of the fluid conduit 100 and/or other electronic components for servicing.

When properly positioned, portions 112 and 114 can carry fluid in proximity to system boards 120 and 122, respectively. In this example, portion 112 can carry cooling fluid in proximity to processors 124. Portion 114 can likewise carry cooling fluid in proximity to another set of processors (not shown). These processors may be operably connected to system boards 120 and 122 as will be understood by those of skill in the art. Particularly, the processors 124 may be suitably connected to processor sockets 128 of system board 120, while the other processors of carrier 104 may be likewise connected to processor sockets 130 of system board 122. In FIG. 1B, for illustrative purposes, processors 124 are shown positioned apart from the portion 112 but align (as shown by broken lines 126) for attachment to the portion 112. The conduit 100 may also carry fluid proximate to other electronic components of the computing device 118.

In an initial step of installation, carrier 104 may be aligned with one or more alignment features 132 of system board 122 such that carrier 104 and its electronic components and portion 114 of the fluid conduit 100 are suitably positioned for its installation to system board 122. In this example, the alignment features are alignment pins 132. Broken lines 134 shown the alignment of carrier 104 with alignment pins 132. The alignment pins 132 may suitably fit to corresponding features of the carrier 104 as will be understood by those of skill in the art. System board 120 may also include pins 136 and/or other alignment features for similarly aligning carrier 102 for installation of electronic components and portion 112 to system board 120.

FIG. 2A illustrates a top perspective view of an example installation step for carrier 104 shown in FIG. 1B in accordance with embodiments of the present disclosure. Particularly, FIG. 2A shows a step of aligning carrier 104 with processor sockets 130 of system board 122 such that the processors of carrier 104 can be connected to respective processor sockets 130. In addition, the portion 114 of the fluid conduit 100 is positioned for carrying cooling fluid proximate to the processors of carrier 104. As described herein, the carrier 104 may be aligned with pins 132 and subsequently moved downward in the direction indicated by arrow 138 until positioned for connection of processors to sockets 130 and proper location of the portion 114 of the fluid conduit 100 during its operation.

FIG. 2B illustrates a detailed perspective view of pins 132 in alignment with corresponding alignment features 200 of carrier 104 in accordance with embodiments of the present disclosure. Referring to FIG. 2B, the alignment features 200 are notches defined within an alignment flange 202. When the carrier 104 is moved in the direction of the arrow 138 shown in FIG. 2A, the pins 132 can fit to notches 200 such that the processors properly connect to sockets 130 and the fluid conduit 100 is in its proper operational position. Similar or the same type of other features may be used for aligning properly carrier 102 and portion 112 of the fluid conduit 100.

Referring again to FIG. 2A, each of the carriers 102 and 104 include screws 110 and/or other fasteners for removably fastening the carriers 102 and 104 to one another. In this example, the carriers 102 and 104 have fastening flanges 204 on their respective ends, and the fasteners are captive thumbscrews 110. Each of the thumbscrews 110 can be received by a hole of the respective fastening flange 204 of the carriers 102 and 104. The thumbscrews 110 and their respective holes may be used for attaching the carriers 102 and 104 to each other to form the unitary structure.

FIG. 2C illustrates a top perspective view of example installation steps for detaching fluid conduit carrier 102 from the fluid conduit carrier 104, rotating fluid conduit carrier 102 with respect to fluid conduit carrier 104, and aligning fluid conduit carrier 102 with an electronic component of a computing device and for positioning the portion 112 of the fluid conduit 100 to carry cooling fluid proximate to the electronic component in accordance with embodiments of the present disclosure. Referring to FIG. 2C, the figure shows the positioning when alignment pins 132 and 136 are aligned with respective alignment features of system boards 120 and 122. As a result of this alignment, carriers 102 and 104 are operationally aligned with system boards 120 and 122, respectively. In an initial step, carrier 104 is aligned with system board 122 and the carriers 102 and 104 are arranged as a unitary structure as shown in FIG. 2A. Subsequently, carrier 102 can be rotated in the direction indicated by arrow 206 to be positioned as shown in FIG. 2C. In the position shown in FIG. 2C, the fluid conduit 100, including portions 112 and 114, are in operational position for cooling electronic components of the computing device 118.

Before rotating the carrier 102 with respect to carrier 104 in the direction of arrow 206, major sides of the carriers 102 and 104 face each other as in the stacked arrangement shown in FIG. 2A. Subsequent to rotating carrier 102 with respect to carrier 104, the opposing major sides of the carriers 102 and 104 face system boards 120 and 122, respectively, and face in the same direction. The other sides of the carrier 102 and 104 face away from the system boards 102 and 104.

Portions 112 and 114 of the fluid conduit 100 are fluidly connected to each other by a portion 208. In this example, the portion 208 is pliable. In this way, the portions 112 and 114 can be moved with respect to one another during alignment and positioning of carriers 102 and 104. While carrier 102 is rotated with respect to carrier 104, the portion 208 is rotated with respect to portion 104. Portion 112 is rotatable with respect to portion 114 while portions 112 and 114 are fluidly connected by portion 208 by portion 208 pliably articulating with respect to portions 112 and 114 to maintain the fluidly connected relationship through portions 112, 114 and 208 without resisting the rotation of portions 112 and 114 with respect to one another.

FIG. 2D illustrates a top perspective view of example steps of releasing carrier 102 from portion 112 of the fluid conduit 100 and releasing carrier 104 from portion 114 of the fluid conduit 100 in accordance with embodiments of the present disclosure. As shown in FIG. 2D, the upper, major sides of carriers 102 and 104 face in the same direction as indicated by arrows 210 and 212, respectively, and face away from portions 112 and 114 of the conduit 100.

Subsequent to aligning carrier 102 with board 120, to align portion 112 with its respective processors 124, portion 112 is attached to its system board 120 for operable positioning proximate the processors. Further, subsequent to aligning carrier 104 with board 122, to align portion 114 with its respective processors (not shown), portion 114 is attached to its system board 122 for operable positioning proximate the processors. Subsequent to the attachment, carriers 102 and 104 may be released from their respective system boards. Further, carriers 102 and 104 may be removed from the system in the direction of arrows 210 and 212, respectively.

Alternative to the configurations and positioning shown in FIGS. 2A-2D, different steps may be taken to move carrier 102 and 104 for installing portions 112 and 114.

FIG. 3A illustrates a top perspective view of an example step of aligning carrier 104 of FIGS. 1A, 1B, and 2A-2D with an electronic component of the computing device 118 for positioning portion 114 of the fluid conduit 100 to carry cooling fluid proximate to the electronic component in accordance with embodiments of the present disclosure. In this example, the portion of the fluid conduit carried by the carrier 104 may be moved for servicing of the exposed internal components of the computing device 118. Referring to FIG. 3A, the electronic component being aligned with the carrier 104 is the system board 122. Once aligned, the carrier 104 may be moved downward in the direction indicated by arrow 300 until in position for attachment to the portion 114 of the fluid conduit 100.

FIG. 3B illustrates a top perspective view of an example step following the example step of FIG. 3A during attachment of carrier 104 to the portion 114 of the fluid conduit 100 in accordance with embodiments of the present disclosure. After attachment to the portion 114, the carrier 104 may be lifted and rotated in a direction indicated by arrow 302 in FIG. 3C.

FIG. 3C illustrates a top perspective view of an example step following the example step of FIG. 3B of articulating and rotating the fluid conduit carrier 104 in accordance with embodiments of the present disclosure. Once rotated in the direction of arrow 302 and positioned as shown in the figure, internal components of system board 122 are exposed for servicing.

FIG. 3D illustrates a top perspective view of an example step following the step of FIG. 3C of removing the system board 122 from the computing device 118 in accordance with embodiments of the present disclosure. Referring to FIG. 3D, this example step includes removing the system board 122 and may include lifting the system board 122 at an end 304 in the direction indicated by arrow 306. Subsequently, the system board 122 may be removed by moving it in the direction indicated by arrow 308. The system board 122 may subsequently be repaired or replaced, and any other electronic component installed to the system board 122 may be accessed without obstruction by its fluid conduit portion 114. Here, processors 310 (shown in FIG. 3E) are shown attached to a side of portion 114. The processors 310 had been installed to both the portion 114 and the processor sockets 130 of system board 122 until the carrier 104 was moved out of the way of access to the system board 122. In this arrangement, the processors 310 may be inspected, replaced, or aligned to the portion 114.

FIG. 3E illustrates a top perspective view of an example step of articulating and rotating the fluid conduit carrier 104 in the direction of arrow 312 to place the processors 310 and portion 114 of the conduit back in operable position in accordance with embodiments of the present disclosure. Subsequent to articulating and rotating, the carrier 104 may be aligned with the system board 122 for positioning the portion 114 of the fluid conduit 100 to carry cooling fluid proximate to the processors 310 when installed.

Carrier 104 and the system board 122 each comprise alignment features configured to align to one another. In this example, the carrier 104 includes an alignment flange 200, and the system board 122 has alignment pins 132. The flange 200 and pins 132 can align with one another for aligning the carrier 104 with the system board 122. Further by lowering the carrier 104, after aligning the carrier 104 with the system board 122, the carrier 104 properly seats the portion 114 to the system board 122.

Subsequent to aligning the carrier 104 with the system board 122, the portion 114 is attached to the electronic components of the system board 122. Then, the carrier 104 may be released from the electronic component and the portion 114. Subsequently, the fluid conduit carrier 104 may be removed.

FIG. 4A illustrates a top perspective view of an example step of positioning the portion 112 of the fluid conduit to carry cooling fluid proximate to its respective system board in accordance with embodiments of the present disclosure. Referring to FIG. 4A, the carrier 102 is aligned with the fluid conduit portion 112. After aligning the carrier 102 with the portion 112, the carrier 102 is attached to the portion 112 such that the carrier 102 holds the portion 112. Subsequently, the carrier 102 can be rotated in the direction indicated by arrows 400 to thereby move the portion 112 away from the system board 120 and expose its components for servicing.

FIG. 4B illustrates a top perspective view of an example step of articulating the carrier 102 of FIG. 4A in accordance with embodiments of the present disclosure. Referring to FIG. 4B, articulating the fluid conduit carrier 102 lifts and rotates the portion 112 away from the system board 120. After articulating, the portion 112 is arranged on top of portion 114 (not shown in FIG. 4B). Visible in this figure are cold plates 402 which may be arranged for transfer of heat to the fluid conduit portion 112.

FIG. 4C illustrates a top perspective view of an example step of installing example processors to the portion of the fluid conduit in accordance with embodiments of the present disclosure. The fluid conduit portion 112 includes cold plates 402 for receiving the processors 404 and includes alignment features for aligning the processors 404 to the cold plates 402 such that aligning and engaging the processors 404 with the cold plates 402 aligns and attaches the processors 404 to the fluid conduit portion 112.

In accordance with embodiments, the alignment features may include heat-conductivity features, such as a heat conducting grease (not shown), for enhancing the ability of the portions 112 and 114 to collect heat from the processors or other electronic components and to carry the heat away from the electronic components with the cooling fluid.

FIG. 4D illustrates a top perspective view of example steps of installing processors (e.g., processors 404 in FIG. 4C) to the system board 120 in accordance with embodiments of the present disclosure. Among these are several successive steps: a step of articulating the carrier 102, lifting the portion 112 away from the second portion 114, rotating the carrier 102 and portion 112 with respect to the portion 114, and aligning the carrier 102 with the system board 120.

The carrier 102 and its system board 120 include alignment features configured to align the carrier 102 to its system board 120. In this example, the carrier 102 has an alignment flange 406 and the system board (not shown) has alignment pins (not shown) that are configured to align with one another (see e.g., FIG. 2B). Aligning the alignment flange 406 with the alignment pins aligns the carrier 102 with the system board. Further lowering the carrier 102 after aligning the carrier 102 with the system board 120 can seat and align the portion 112 with the system board 120.

After aligning the carrier 102 with the system board 120, the portion 112 may be used to attach to the processors 404 (see e.g. FIG. 4C) to the processor sockets 128. Subsequently, the carrier 102 may be released from the system board 120 and the portion 112. Here, because the processors 404 were installed to the portion 112 (see e.g. FIG. 4C), aligning the carrier 102 and fastening the portion 112 to the system board 120 aligned and fastened the processors 404 to the system board 120. Subsequently, the carrier 102 can be removed from the system (not shown).

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:
1. A system comprising:
a fluid conduit comprising a first portion and a second portion that are fluidly connected to each other for carrying cooling fluid proximate to a first electronic component and a second electronic component of a computing device, respectively;
a first fluid conduit carrier comprising an alignment feature and configured to hold the first portion of the fluid conduit and align the first fluid conduit carrier with the first electronic component; and
a second fluid conduit carrier comprising an alignment feature and configured to hold the second portion of the fluid conduit and align the second fluid conduit carrier with the first electronic component,
wherein the first fluid conduit carrier and the second fluid conduit carrier are configured to alternately rigidly connect and disconnect to one another while at least one of the first fluid conduit carrier is holding the first portion of the fluid conduit and the second fluid conduit carrier is holding the second portion of the fluid conduit, wherein the first fluid conduit carrier and the second fluid conduit carrier each have a first side and a second side, wherein the first fluid conduit carrier and the second fluid conduit carrier are configured to be fastened together in an arrangement with respect to each other such that the first sides face each other, and wherein when the first fluid conduit carrier and the second fluid conduit carrier are unfastened from each other, the first fluid conduit carrier and the second fluid conduit carrier are configured to be arranged such that the first sides are adjacent to each other and substantially face in the same direction.

2. The system of claim 1, wherein the fluid conduit comprises a pliable material.

3. The system of claim 1, wherein the fluid conduit further comprises a third portion that fluidly connects the first portion and the second portion, and wherein the third portion is pliable.

4. The system of claim 1, wherein the first fluid conduit carrier is configured to removably attach to the first portion of the fluid conduit, and wherein the second fluid conduit carrier is configured to removably attach to the second portion of the fluid conduit.

5. The system of claim 1, wherein the first fluid conduit carrier is configured to removably fasten to the second fluid conduit carrier.

6. The system of claim 1, wherein the first fluid conduit carrier and the second fluid conduit carrier form a unitary structure.

7. The system of claim 1, wherein when the first fluid conduit carrier and the second fluid conduit carrier are fastened to each other, the first fluid conduit carrier and the second fluid conduit carrier are in a stacked arrangement.

8. The system of claim 1, wherein the second sides of the first fluid conduit carrier and the second fluid conduit carrier are configured to hold the first portion and the second portion, respectively, of the fluid conduit.

9. The system of claim 1, wherein the first electronic component comprises one of a system board, a processor, a memory device, and a dual in-line memory module (DIMM).

10. The system of claim 9, wherein the first portion is configured to align the first electronic component with respect to a system board of the computing device.

11. A method comprising:
providing a system comprising:
a fluid conduit comprising a first portion and a second portion that are fluidly connected to each other;
a first fluid conduit carrier holding the first portion of the fluid conduit; and
a second fluid conduit carrier holding the second portion of the fluid conduit;
wherein the first fluid conduit carrier and the second fluid conduit carrier are configured to alternately rigidly connect and disconnect to one another;
aligning the first fluid conduit carrier with a first electronic component of a computing device for positioning the first portion of the fluid conduit to carry cooling fluid proximate to the first electronic component;
aligning the second fluid conduit carrier with a second electronic component of the computing device for positioning the second portion of the fluid conduit to carry cooling fluid proximate to the second electronic component; and
releasing the second fluid conduit carrier from the second portion of the fluid conduit.

12. The method of claim 11, wherein aligning the first fluid conduit carrier with the first electronic component comprises aligning the first fluid conduit carrier with the first electronic component while the first fluid conduit carrier and the second fluid conduit carrier are rigidly fastened to one another.

13. The method of claim 12, further comprising detaching the second fluid conduit carrier and rotating the second fluid conduit carrier with respect to the first fluid conduit carrier before aligning the second fluid conduit carrier with the second electronic component.

14. The method of claim 11, wherein the aligning of the first fluid conduit carrier with the first electronic component aligns another electronic component for installation of the another electronic component on the computing device.

15. The method of claim 11, further comprising aligning another electronic component of the computing device to the first portion.

16. The method of claim 11, further comprising releasing the first conduit carrier from the first portion of the fluid conduit and removing the first fluid conduit carrier from the computing device.

17. A method comprising:
providing a system comprising:
a fluid conduit comprising a first portion and a second portion that are fluidly connected to each other, the first portion and the second portion configured to carry cooling fluid proximate to a first electronic component and a second electronic component, respectively, of a computing device, the first and second portions each comprising a first side facing away from the computing device and a second side facing the computing device; and
a first fluid conduit carrier configured to hold the first portion of the fluid conduit,
aligning the first fluid conduit carrier with the first portion of the fluid conduit;
attaching the first portion of the fluid conduit to the first fluid conduit carrier;
articulating the first fluid conduit carrier such that the first side of the first portion of the fluid conduit faces the first side of the second portion of the fluid conduit;
articulating the first fluid conduit carrier such that the first side of the first portion of the fluid conduit faces away from the computing device and the second side of the first portion of the fluid conduit faces the computing device; and
releasing the first fluid conduit carrier from the first portion of the fluid conduit,
wherein the first fluid conduit carrier is configured to alternately rigidly connect and disconnect to a second fluid conduit carrier that is configured to align, attach, and articulate in the same manner as the first fluid conduit carrier, wherein the ability of first fluid conduit carrier to align, attach, and articulate is preserved while the first fluid conduit carrier is rigidly connected to the second fluid conduit carrier.

18. The method of claim 17, further comprising:
detaching the first portion of the fluid conduit from the computing device after attaching the first portion of the fluid conduit to the fluid conduit carrier and before articulating the fluid conduit carrier such that the first side of the first portion of the fluid conduit faces the first side of the second portion of the fluid conduit, wherein articulating the fluid conduit carrier such that the first side of the first portion of the fluid conduit faces away from the computing device and the second side of the first portion of the fluid conduit faces the computing device comprises aligning the first portion of the fluid conduit with the first electronic component and reattaching the first portion of the fluid conduit to the computing device.

19. The method of claim 17, further comprising:

aligning the fluid conduit carrier with the second portion of the fluid conduit;

attaching the second portion of the fluid conduit to the fluid conduit carrier;

articulating the fluid conduit carrier such that the first side of the second portion of the fluid conduit faces the first side of the first portion of the fluid conduit;

articulating the fluid conduit carrier such that the first side of the second portion of the fluid conduit faces away from the computing device and the second side of the second portion of the fluid conduit faces the computing device; and releasing the fluid conduit carrier from the second portion of the conduit.

20. The method of claim 19, further comprising:

detaching the second portion of the fluid conduit from the computing device after attaching the second portion of the fluid conduit to the fluid conduit carrier and before articulating the fluid conduit carrier such that the first side of the second portion of the fluid conduit faces the first side of the first portion of the fluid conduit, wherein articulating the fluid conduit carrier such that the first side of the second portion of the fluid conduit faces away from the computing device and the second side of the second portion of the fluid conduit faces the computing device comprises aligning the second portion of the fluid conduit with the second electronic component and reattaching the second portion of the fluid conduit to the computing device.

\* \* \* \* \*